(12) United States Patent
Shimada

(10) Patent No.: US 7,732,361 B2
(45) Date of Patent: Jun. 8, 2010

(54) DIELECTRIC PORCELAIN COMPOSITION FOR USE IN ELECTRONIC DEVICES

(75) Inventor: Takeshi Shimada, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 206 days.

(21) Appl. No.: 12/063,483

(22) PCT Filed: Aug. 11, 2005

(86) PCT No.: PCT/JP2005/014770

§ 371 (c)(1),
(2), (4) Date: Jun. 9, 2008

(87) PCT Pub. No.: WO2007/017950

PCT Pub. Date: Feb. 15, 2007

(65) Prior Publication Data

US 2009/0111680 A1    Apr. 30, 2009

(51) Int. Cl.
*C04B 35/495* (2006.01)
(52) U.S. Cl. ..................................... 501/135
(58) Field of Classification Search ............ 501/135
See application file for complete search history.

(56) References Cited

U.S. PATENT DOCUMENTS

| | | | |
|---|---|---|---|
| 5,023,219 | A | 6/1991 | Kageyama |
| 6,331,498 | B1 * | 12/2001 | Shimada et al. ............ 501/135 |
| 6,413,896 | B1 * | 7/2002 | Shimada et al. ............ 501/135 |

FOREIGN PATENT DOCUMENTS

| | | |
|---|---|---|
| JP | 2-285616 | 11/1990 |
| JP | 4-260656 | 9/1992 |
| JP | 11-189468 | 7/1999 |
| JP | 2003-226575 | 8/2003 |

OTHER PUBLICATIONS

English Translation of Search Report issued in International Patent Application No. PCT/JP2005/014770 on Oct. 25, 2005.
Kim et al., "Microwave Dielectric Properties of $Ba(Mg_{1/3}Ta_{2/3})O_3$ Ceramics With Partial Substitution of Mg by Ca or Ni," Ceramic Transactions (1998), 32 (Dielectric Ceramics: Processing, Properties, and Applications), pp. 231-240, 1993, Fig 1, Tables 1, 2; Figs. 2, 3, 4, 5 6.
Reaney et al., "Ordering and Quality Factor in $0.95BaZn_{1/3}Ta_{2/3}O_3$-$0.05SrGa_{1/2}Ta_{1/2}O_3$ Production Resonators," Journal of the European Ceramic Society, 2003, vol. 23, No. 16, p. 3021-3034, 2003, Table 1.

* cited by examiner

*Primary Examiner*—Karl E Group
(74) *Attorney, Agent, or Firm*—Stein McEwen, LLP

(57) ABSTRACT

The invention intends to provide a dielectric porcelain composition for use in electronic devices which can be controlled in the temperature coefficient τf in particular in a negative direction and can shorten a sintering period while maintaining a high Qf value and a high dielectric constant. According to the invention, in conventional composition having a composition formula represented by $XBa(Mg_{1/3}Ta_{2/3})O_3$—$Y(Ba_zSr_{1-z})(Ga_{1/2}Ta_{1/2})O_3$, when Mg is substituted by Ni to form a specific structure, the temperature coefficient τf can be controlled in a negative direction and the τf can be controlled in the range of 0.80 to −4.45 ppm/° C. while maintaining a high Qf value and a high dielectric constant, and even when a sintering period, which has been so far necessary substantially 50 hr, is reduced to 25 hr substantially one half the above, similar Qf value can be obtained.

2 Claims, No Drawings

DIELECTRIC PORCELAIN COMPOSITION FOR USE IN ELECTRONIC DEVICES

CROSS-REFERENCE TO RELATED APPLICATIONS

This application claims the benefit of PCT International Patent Application No. PCT/JP2005/014770, filed Aug. 11, 2005, and is related to Japanese Patent Application No. 2004-146338, filed May 17, 2004, in the Japanese Patent Office, the disclosures of which are incorporated herein by reference.

TECHNICAL FIELD

The invention relates to an improvement in a dielectric porcelain composition for use in a communication filter in sub-micrometer wave or micrometer wave and millimeter wave, an oscillator, a dielectric substrate or the like, and relates to a dielectric porcelain composition for use in electronic devices, which maintains a high Qf value and a high dielectric constant and has a temperature coefficient τf at a resonant frequency shifted in a negative direction to be controlled in a required range.

BACKGROUND ART

Conventionally, as a material useful for a high-frequency band device, $Ba(Mg_{1/3}Ta_{2/3})O_3$ materials have been known. Although the $Ba(Mg_{1/3}Ta_{2/3})O_3$ materials have a very high Qf value, they are materials difficult to be sintered. That is, it is necessary to be sintered for a long time in accordance with a rapid temperature-up sintering process or a sintering process in oxygen, for instance, at a temperature-up speed in the range of 500 to 1000° C./min, at a sintering temperature in the range of 1500 to 1600° C. for a sintering period of substantially 100 hr, resulting in lacking the mass productivity and in difficulty of obtaining stable Qf value.

Furthermore, in order to use them in a high-frequency band device, the temperature coefficient τf at a prescribed resonant frequency has to be controlled depending on the applications. However, $Ba(Mg_{1/3}Ta_{2/3})O_3$ materials are known to have τf in the proximity of +1.5 ppm/° C. and it is difficult to control the τf thereof because they are made of a single compound.

As a material that can be improved in sinterability and can be controlled in temperature coefficient τf, a composition having a composition formula represented by $XBa(Mg_{1/3}Ta_{2/3})O_3—Y(Ba_zSr_{1-z})(Ga_{1/2}Ta_{1/2})O_3$ has been proposed (see, patent document 1). Although this composition has a high Qf value (250,000 GHz or more) and is controllable in temperature coefficient τf, there still remains a problem in sinterability and, since the temperature coefficient τf at a resonant frequency is substantially in the range of 3 to 4 ppm/° C., it is difficult to control it to the proximity of zero.

On the other hand, as a composition that can be controlled in temperature coefficient τf at the resonant frequency, a composition represented by $XBa(Zn_{1/3}Ta_{2/3})O_3—Y(Ba_zSr_{1-z})(Ga_{1/2}Ta_{1/2})O_3$ has been proposed (see, patent document 2). Although this composition is controllable in the temperature coefficient τf, there is a problem in that, in comparison with the composition shown in the patent document 1, the Qf value is low to thereby result in restriction on use in a high frequency region of 10 GHz or more.

In this connection, the present applicant has proposed, as a composition that maintains a high Qf value to enable control of the temperature characteristics τf and shortening of the sintering period, a composition represented by $XBa[(Mg_{1-z}Zn_z)_{1/3}Ta_{2/3}]O_3—YSr(Ga_{1/2}Ta_{1/2})O_3$ (see, patent document 3).

Patent document 1: JP-A-4-260656
Patent document 2: JP-A-11-189468
Patent document 3: JP-A-2003-226575

DISCLOSURE OF THE INVENTION

Problem that the Invention is to Solve

A composition of patent document 3 has a configuration where Mg at a B site of a Ba(Mg.Ta) oxide is substituted by Zn. However, in such a composition, in order to shift the temperature coefficient τf in a negative direction to reach 0 ppm/° C., there is a problem that Zn has to be substituted a lot, whereby the Qf value is lowered. Furthermore, there is a problem that Zn tends to be volatilized when the sintering is carried out for a long time and, in this case, a composition varies to deteriorate the characteristics thereof.

In order to control the temperature coefficient τf, other than the substitution of B site such as substitution of Mg with Zn as in the patent document 3, the temperature coefficient τf can be also controlled by substituting an A site, that is, by substituting Ba as well. However, according to the substitution of the A site, there is a problem that the temperature coefficient τf does not shift in a negative direction but shifts in a positive direction.

The invention intends to overcome the problems of the conventional dielectric porcelain compositions and to provide a dielectric porcelain composition for use in electronic devices which can be controlled in the temperature coefficient τf in particular in a negative direction and can shorten a sintering period while maintaining a high Qf value and a high dielectric constant.

Means for Solving the Problem

The inventors have made intensive studies on a composition that has a composition formula represented by $XBa(Mg_{1/3}Ta_{2/3})O_3—Y(Ba,Sr_{1-z})(Ga_{1/2}Ta_{1/2})O_3$, and found that, when Mg is substituted by Ni in this composition, the temperature coefficient τf can be controlled in a negative direction to enable control of the τf in the range of 0.80 to −4.45 ppm/° C. while maintaining a high Qf value and a high dielectric constant, and even when a sintering period that has been so far necessary substantially 50 hr is reduced to 25 hr substantially one half the above, similar Qf value can be obtained. Thus, the invention has been completed.

That is, a dielectric porcelain composition according to the invention for use in electronic devices has a composition represented by a composition formula: $(1-X)Ba[(Mg_{1-y}Ni_y)_{1/3}Ta_{2/3}]O_3—XSr(Ga_{1/2}Ta_{1/2})O_3$, in which X and y in the composition formula each satisfy $0<X\leqq0.1$ and $0.05\leqq y\leqq 0.25$.

Furthermore, the dielectric porcelain composition for use in electronic devices is characterized by having characteristics that Qf is 180,000 GHz or more and τf is 0.80 to −4.45 ppm/° C.

ADVANTAGE OF THE INVENTION

According to the invention, it is possible to obtain a dielectric porcelain composition in which the temperature coefficient τf at the resonant frequency can be shifted in a negative direction and the τf can be controlled in the range of 0.80 to −4.45 ppm/° C. while maintaining a high Qf value of 180,000 GHz or more and a high dielectric constant.

According to the invention, the sintering period which is necessary to be substantially 50 hr in conventional dielectric porcelain compositions can be shortened to substantially one half, that is, 25 hr or less.

Since the dielectric porcelain composition according to the invention for use in electronic devices does not employ Zn that is a volatilizing component, the characteristics thereof are not deteriorated with a composition variation due to the sintering.

BEST MODE FOR CARRYING OUT THE INVENTION

According to the invention, by substituting Mg in $(1-X)Ba(Mg_{1/3}Ta_{2/3})O_3$ by Ni, even with a small substitution amount, a solid solution of $(1-X)Ba(Mg_{1/3}Ta_{2/3})O_3$ and $XSr(Ga_{1/2}Ta_{1/2})O_3$ ($0<X\leq0.1$) can be controlled in the temperature coefficient $\tau f$ in a negative direction and can be produced by sintering for a relatively short time while maintaining a high Qf value and a high dielectric constant.

It is considered due to an increase in the damping constant of a vibration of Ta layers that the temperature coefficient $\tau f$ can be controlled in a negative direction by slightly substituting Mg by Ni. This is because Ni preferentially substitutes Mg mingled in a Ta layer without disturbing the ordering of the B sites.

According to the dielectric porcelain composition of the invention, reasons for limiting X and y that show the respective component ranges are as follows.

X represents a component range of $Ba[(Mg_{1-y}Ni_y)_{1/3}Ta_{2/3}]O_3$ and $Sr(Ga_{1/2}Ta_{1/2})O_3$ and is preferably in the range of $0<X\leq0.1$. When X exceeds 0.1, the Qf value of dielectric porcelain composition obtained is unfavorably considerably deteriorated.

In the next place, y represents a component range of Mg and Ni and is preferably in the range of $0.05\leq y\leq0.25$. When y is less than 0.05, the temperature coefficient $\tau f$ cannot be controlled and, when y exceeds 0.25, the Qf value becomes unfavorably smaller and the temperature coefficient $\tau f$ unfavorably becomes larger in a negative direction.

The dielectric porcelain composition of the invention can be obtained in accordance with a production process such as shown below. Furthermore, when preferable production conditions described below are appropriately selected, the Qf value of the obtained dielectric porcelain composition for use in electronic devices can be improved.

(1) The respective oxide powders as raw materials are weighed so that a composition formula after sintering may be $(1-X)Ba[(Mg_{1-y}Ni_y)_{1/3}Ta_{2/3}]O_3$—$XSr(Ga_{1/2}Ta_{1/2})O_3$ ($0<X\leq0.1$ and $0.05\leq y\leq0.25$).

(2) To the respective oxide powders, pure water or ethanol are added, followed by mixing and pulverizing. An average particle diameter of the mixed and pulverized mixed powder is preferably in the range of 0.7 to 1.4 μm.

(3) The mixture is dried and then calcined. A drying temperature is preferably set in the range of 100 to 200° C., a calcination temperature is preferably set in the range of 1100 to 1400° C. and a calcination period is preferably set in the range of 2 to 6 hr.

(4) The calcined powder is pulverized. Pulverization is preferably carried out in pure water or ethanol. Furthermore, an average particle diameter of the pulverized powder is preferably in the range of 0.6 to 1.5 μm.

(5) The pulverized powder is dried and then formed by means of desired forming means. Before forming, the pulverized powder may optionally be granulated by the use a granulating device. The forming pressure at the forming is preferably in the range of 3.0 to 5.2 g/cm³.

(6) The green compact is sintered. Sintering atmosphere is preferably in air or in an atmosphere having an oxygen concentration from 50 to 100%, a sintering temperature is preferably set in the range of 1500 to 1700° C. and particularly preferably in the range of 1550 to 1650° C., and a sintering period is preferably set in the range of 10 to 50 hr. Furthermore, when granulation is applied, before sintering, a degreasing operation is preferably applied at a temperature in the range of 300 to 700° C.

EXAMPLES

Example 1

As starting materials, powders of $BaCO_3$, $SrCO_3$, MgO, NiO, $Ta_2O_5$ and $Ga_2O_3$ were prepared. These were concocted so that a composition formula after sintering is represented by $(1-X)Ba[(Mg_{1-y}Ni_y)_{1/3}Ta_{2/3}]O_3$—$XSr(Ga_{1/2}Ta_{1/2})O_3$, in which X may be 0.01, 0.05 or 0.10 and y may be 0, 0.05, 0.10, 0.15, 0.20, 0.25 or 0.30, then mixed and pulverized in pure water, followed by drying, thereby obtaining mixed powders having an average particle diameter of 0.8 μm.

In the next place, the mixed powders were calcined at 1300° C. for 4 hr. The calcined powders thus obtained were pulverized by an wet process to have a center particle diameter of 1.0 μm, followed by drying. Then, PVA was added to each of the dried powder, followed by mixing, further followed by granulating by means of a granulating device.

The granulated powders thus obtained were formed by the use of a uniaxial press machine to have a forming density of 3.5 to 4.0 g/cm³. The formed bodies thus obtained were degreased at a temperature in the range of 300 to 700° C., followed by sintering in an atmosphere having an oxygen concentration of 85% at 1600° C. for 10, 25 or 50 hr, thereby obtaining sintered bodies.

The sintered bodies thus obtained each were processed into a size of φ 10 mm×9 to 4 mm to thereby obtain test pieces. The test pieces thus obtained were measured of the dielectric constant, Qf value and $\tau f$ value in accordance with the H&C method using a network analyzer. Measurement results are shown in Tables 1 through 3. Table 1 shows a case where X is 0.01, Table 2 shows a case where X is 0.05 and Table 3 shows a case where X is 0.10. In Tables 1 through 3, those having an * mark next to a number are comparative examples and show cases where y is 0 or 0.3.

As shown in Tables 1 through 3, by substituting Mg by a small amount of Ni, the dielectric porcelain composition according to the invention for use in electronic devices can shift the temperature coefficient $\tau f$ at the resonant frequency in a negative direction and control the $\tau f$ in the range of 0.80 to −4.45 ppm/° C. while maintaining a high Qf value of 180,000 GHz or more and a high dielectric constant.

Furthermore, even when a sintering period, which has been necessarily to be substantially 50 hr in conventional dielectric porcelain compositions, is shortened to 25 hr or less, that is, one half the conventional, similar characteristics can be obtained.

Comparative Example 1

As starting materials, powders of $BaCO_3$, $SrCO_3$, MgO, NiO, $Ta_2O_5$ and $Ga_2O_3$ were prepared. These were concocted so that a composition formula after sintering is represented by $(1-X)Ba[(Mg_{1-y}Zn_y)_{1/3}Ta_{2/3}]O_3$—$XSr(Ga_{1/2}Ta_{1/2})O_3$, in which X may be 0.10, 0.25 or 0.40 and y may be 0.1, 0.2, 0.3, 0.4 or 0.5, then mixed and pulverized in pure water, followed by drying, thereby obtaining mixed powders having an average particle diameter of 0.8 μm.

After being calcined and wet pulverized as in example 1, the pulverized powders were dried and granulated by the use of a granulating device. The granulated powders thus obtained were formed by the use of a uniaxial press machine to the forming density in the range of 3.5 to 4.0 g/cm³. The formed bodies thus obtained were degreased at a temperature in the range of 300 to 700° C., followed by sintering in an atmosphere having an oxygen concentration of 85% at 1650° C. for 10, 25 and 50 hr. thereby obtaining sintered bodies.

The sintered bodies thus obtained each were processed into a size of φ10 mm×5 mm to thereby obtain test pieces. The test pieces thus obtained were measured of the dielectric constant, Qf value and τf value in accordance with the H&C method using a network analyzer. Measurement results are shown in Tables 4 through 6. Table 4 shows a case where X is 0.10, Table 5 shows a case where X is 0.25 and Table 6 shows a case where X is 0.40.

As shown in Tables 4 through 6, in comparative examples where Mg is substituted by Zn, a substitution amount of Zn has to be increased in order to shift the temperature coefficient τf in a negative direction, whereby the Qf value is considerably lowered. When the temperature coefficient τf is shifted in a negative direction with maintaining the Qf value, there is a limit around τf=−0.7 ppm/° C.

TABLE 1

| No. | Sintering period (hr) | X | y | εr | Qf (GHz) | τf (ppm/° C.) |
|---|---|---|---|---|---|---|
| 1* | 10 | 0.01 | 0.00 | 22.68 | 202715 | 1.52 |
| 2 | 10 | 0.01 | 0.05 | 24.26 | 244826 | 0.72 |
| 3 | 10 | 0.01 | 0.10 | 24.05 | 226440 | −0.48 |
| 4 | 10 | 0.01 | 0.15 | 24.01 | 196823 | −2.47 |
| 5 | 10 | 0.01 | 0.20 | 24.06 | 198567 | −3.63 |
| 6 | 10 | 0.01 | 0.25 | 23.98 | 190666 | −4.31 |
| 7* | 10 | 0.01 | 0.30 | 23.94 | 177165 | −6.22 |
| 8* | 25 | 0.01 | 0.00 | 24.19 | 327177 | 1.68 |
| 9 | 25 | 0.01 | 0.05 | 24.49 | 307937 | 0.80 |
| 10 | 25 | 0.01 | 0.10 | 24.41 | 267025 | −0.54 |
| 11 | 25 | 0.01 | 0.15 | 24.29 | 255953 | −2.34 |
| 12 | 25 | 0.01 | 0.20 | 24.30 | 226942 | −3.59 |
| 13 | 25 | 0.01 | 0.25 | 24.25 | 234981 | −4.30 |
| 14* | 25 | 0.01 | 0.30 | 24.15 | 192758 | −6.27 |
| 15* | 50 | 0.01 | 0.00 | 24.30 | 321803 | 1.74 |
| 16 | 50 | 0.01 | 0.05 | 24.59 | 319970 | 0.59 |
| 17 | 50 | 0.01 | 0.10 | 24.50 | 301101 | −0.60 |
| 18 | 50 | 0.01 | 0.15 | 24.39 | 272558 | −2.04 |
| 19 | 50 | 0.01 | 0.20 | 24.40 | 249297 | −3.26 |
| 20 | 50 | 0.01 | 0.25 | 24.29 | 215367 | −4.45 |
| 21* | 50 | 0.01 | 0.30 | 24.20 | 215217 | −6.21 |

TABLE 2

| No. | Sintering period (hr) | X | y | εr | Qf (GHz) | τf (ppm/° C.) |
|---|---|---|---|---|---|---|
| 22* | 10 | 0.05 | 0.00 | 22.62 | 199451 | 1.41 |
| 23 | 10 | 0.05 | 0.05 | 24.29 | 242172 | 0.67 |
| 24 | 10 | 0.05 | 0.10 | 24.04 | 220202 | −0.45 |
| 25 | 10 | 0.05 | 0.15 | 24.09 | 191838 | −2.30 |
| 26 | 10 | 0.05 | 0.20 | 24.03 | 191110 | −3.37 |
| 27 | 10 | 0.05 | 0.25 | 23.99 | 181430 | −4.01 |
| 28* | 10 | 0.05 | 0.30 | 23.92 | 165037 | −5.79 |
| 29* | 25 | 0.05 | 0.00 | 24.21 | 320653 | 1.56 |
| 30 | 25 | 0.05 | 0.05 | 24.39 | 304493 | 0.74 |
| 31 | 25 | 0.05 | 0.10 | 24.42 | 260356 | −0.50 |
| 32 | 25 | 0.05 | 0.15 | 24.36 | 248695 | −2.18 |
| 33 | 25 | 0.05 | 0.20 | 24.34 | 218111 | −3.34 |
| 34 | 25 | 0.05 | 0.25 | 24.30 | 224998 | −4.00 |
| 35* | 25 | 0.05 | 0.30 | 24.24 | 182435 | −5.83 |
| 36* | 50 | 0.05 | 0.00 | 24.33 | 319105 | 1.62 |
| 37 | 50 | 0.05 | 0.05 | 24.44 | 316603 | 0.55 |
| 38 | 50 | 0.05 | 0.10 | 24.52 | 295864 | −0.56 |
| 39 | 50 | 0.05 | 0.15 | 24.40 | 265571 | −1.90 |
| 40 | 50 | 0.05 | 0.20 | 24.39 | 241072 | −3.03 |

TABLE 2-continued

| No. | Sintering period (hr) | X | y | εr | Qf (GHz) | τf (ppm/° C.) |
|---|---|---|---|---|---|---|
| 41 | 50 | 0.05 | 0.25 | 24.34 | 205511 | −4.14 |
| 42* | 50 | 0.05 | 0.30 | 24.26 | 204009 | −5.77 |

TABLE 3

| No. | Sintering period (hr) | X | y | εr | Qf (GHz) | τf (ppm/° C.) |
|---|---|---|---|---|---|---|
| 43* | 10 | 0.10 | 0.00 | 22.55 | 193370 | 1.46 |
| 44 | 10 | 0.10 | 0.05 | 24.65 | 234827 | 0.70 |
| 45 | 10 | 0.10 | 0.10 | 24.09 | 213409 | −0.44 |
| 46 | 10 | 0.10 | 0.15 | 24.11 | 191933 | −2.35 |
| 47 | 10 | 0.10 | 0.20 | 24.08 | 185953 | −3.45 |
| 48 | 10 | 0.10 | 0.25 | 23.98 | 185710 | −4.13 |
| 49* | 10 | 0.10 | 0.30 | 23.92 | 159722 | −5.79 |
| 50* | 25 | 0.10 | 0.00 | 24.18 | 310838 | 1.54 |
| 51 | 25 | 0.10 | 0.05 | 24.36 | 295255 | 0.73 |
| 52 | 25 | 0.10 | 0.10 | 24.36 | 252345 | −0.48 |
| 53 | 25 | 0.10 | 0.15 | 24.31 | 241016 | −2.32 |
| 54 | 25 | 0.10 | 0.20 | 24.32 | 211303 | −3.48 |
| 55 | 25 | 0.10 | 0.25 | 24.27 | 217949 | −4.13 |
| 56* | 25 | 0.10 | 0.30 | 24.13 | 176652 | −5.71 |
| 57* | 50 | 0.10 | 0.00 | 24.38 | 309451 | 1.57 |
| 58 | 50 | 0.10 | 0.05 | 24.48 | 307004 | 0.55 |
| 59 | 50 | 0.10 | 0.10 | 24.50 | 286831 | −0.57 |
| 60 | 50 | 0.10 | 0.15 | 24.35 | 257394 | −1.98 |
| 61 | 50 | 0.10 | 0.20 | 24.32 | 233593 | −3.06 |
| 62 | 50 | 0.10 | 0.25 | 24.25 | 199050 | −4.09 |
| 63* | 50 | 0.10 | 0.30 | 24.19 | 197552 | −5.83 |

TABLE 4

| No. | Sintering period (hr) | X | y | εr | Qf (GHz) | τf (ppm/° C.) |
|---|---|---|---|---|---|---|
| 64* | 10 | 0.10 | 0.10 | 25.31 | 255518 | 1.34 |
| 65* | 10 | 0.10 | 0.20 | 25.80 | 251968 | 0.99 |
| 66* | 10 | 0.10 | 0.30 | 26.15 | 249783 | −0.01 |
| 67* | 10 | 0.10 | 0.40 | 26.74 | 206642 | −0.52 |
| 68* | 10 | 0.10 | 0.50 | 27.05 | 170662 | −1.00 |
| 69* | 20 | 0.10 | 0.10 | 25.28 | 256638 | 1.10 |
| 70* | 20 | 0.10 | 0.20 | 25.71 | 262237 | 0.77 |
| 71* | 20 | 0.10 | 0.30 | 26.08 | 223369 | −0.23 |
| 72* | 20 | 0.10 | 0.40 | 26.65 | 227651 | −0.71 |
| 73* | 20 | 0.10 | 0.50 | 26.80 | 181138 | −1.29 |
| 74* | 50 | 0.10 | 0.10 | 25.25 | 257916 | 2.46 |
| 75* | 50 | 0.10 | 0.20 | 25.63 | 271934 | 1.49 |
| 76* | 50 | 0.10 | 0.30 | 26.01 | 224017 | 0.12 |
| 77* | 50 | 0.10 | 0.40 | 26.60 | 229814 | −0.54 |
| 78* | 50 | 0.10 | 0.50 | 26.67 | 221023 | −1.11 |

TABLE 5

| No. | Sintering period (hr) | X | y | εr | Qf (GHz) | τf (ppm/° C.) |
|---|---|---|---|---|---|---|
| 79* | 10 | 0.25 | 0.10 | 25.25 | 253218 | 1.29 |
| 80* | 10 | 0.25 | 0.20 | 25.41 | 251666 | 0.94 |
| 81* | 10 | 0.25 | 0.30 | 26.04 | 244781 | −0.12 |
| 82* | 10 | 0.25 | 0.40 | 26.66 | 221212 | −0.45 |
| 83* | 10 | 0.25 | 0.50 | 26.99 | 170021 | −0.89 |
| 84* | 20 | 0.25 | 0.10 | 25.25 | 251239 | 0.99 |
| 85* | 20 | 0.25 | 0.20 | 25.70 | 261815 | 0.73 |
| 86* | 20 | 0.25 | 0.30 | 26.02 | 222237 | −0.29 |
| 87* | 20 | 0.25 | 0.40 | 26.46 | 205456 | −0.72 |
| 88* | 20 | 0.25 | 0.50 | 26.77 | 172122 | −1.32 |
| 89* | 50 | 0.25 | 0.10 | 25.24 | 256826 | 2.41 |
| 90* | 50 | 0.25 | 0.20 | 25.61 | 270011 | 1.42 |
| 91* | 50 | 0.25 | 0.30 | 25.97 | 223911 | 0.11 |

TABLE 5-continued

| No. | Sintering period (hr) | X | y | εr | Qf (GHz) | τf (ppm/° C.) |
|---|---|---|---|---|---|---|
| 92* | 50 | 0.25 | 0.40 | 26.54 | 229004 | −0.47 |
| 93* | 50 | 0.25 | 0.50 | 26.56 | 209678 | −0.98 |

TABLE 6

| No. | Sintering period (hr) | X | y | εr | Qf (GHz) | τf (ppm/° C.) |
|---|---|---|---|---|---|---|
| 94* | 10 | 0.40 | 0.10 | 25.19 | 228383 | 0.99 |
| 95* | 10 | 0.40 | 0.20 | 25.34 | 218999 | 0.82 |
| 96* | 10 | 0.40 | 0.30 | 25.91 | 223685 | 0.03 |
| 97* | 10 | 0.40 | 0.40 | 26.46 | 196028 | −0.46 |
| 98* | 10 | 0.40 | 0.50 | 26.67 | 164632 | −0.91 |
| 99* | 20 | 0.40 | 0.10 | 25.16 | 233313 | 1.26 |
| 100* | 20 | 0.40 | 0.20 | 25.58 | 239148 | 0.72 |
| 101* | 20 | 0.40 | 0.30 | 25.96 | 204218 | 0.02 |
| 102* | 20 | 0.40 | 0.40 | 26.33 | 199823 | −0.46 |
| 103* | 20 | 0.40 | 0.50 | 26.66 | 177136 | −0.89 |
| 104* | 50 | 0.40 | 0.10 | 25.21 | 236991 | 2.33 |
| 105* | 50 | 0.40 | 0.20 | 25.51 | 247631 | 1.32 |
| 106* | 50 | 0.40 | 0.30 | 25.93 | 206147 | 0.08 |
| 107* | 50 | 0.40 | 0.40 | 26.46 | 207781 | −0.34 |
| 108* | 50 | 0.40 | 0.50 | 26.49 | 198563 | −0.88 |

INDUSTRIAL APPLICABILITY

The dielectric porcelain composition according to the invention for use in electronic devices is capable of maintaining a high Qf value of 180,000 GHz or more and a high dielectric constant and controlling the temperature coefficient τf at the resonant frequency in the range of 0.80 to −4.45 ppm/° C.; and therefore, it is optimal for use in a communication filter in sub-micrometer wave or micrometer wave and millimeter wave, an oscillator, a dielectric substrate or the like, and can improve performance of an electronic device.

The invention claimed is:

1. A dielectric porcelain composition for use in an electronic device, which has a composition represented by a composition formula: $(1-X)Ba[(Mg_{1-y}Ni_y)_{1/3}Ta_{2/3}]O_3$—$XSr(Ga_{1/2}Ta_{1/2})O_3$, wherein X and y in the composition formula each satisfy $0 < X \leqq 0.1$ and $0.05 \leqq y \leqq 0.25$.

2. The dielectric porcelain composition for use in an electronic device according to claim 1, wherein said porcelain composition has characteristics that Qf is 180,000 GHz or more and τf is 0.80 to −4.45 ppm/° C.

\* \* \* \* \*